United States Patent
Hill

(10) Patent No.: US 10,337,105 B2
(45) Date of Patent: Jul. 2, 2019

(54) METHOD AND APPARATUS FOR VALVE DEPOSITION CLEANING AND PREVENTION BY PLASMA DISCHARGE

(71) Applicant: MKS Instruments, Inc., Andover, MA (US)

(72) Inventor: Gordon Hill, Arlington, MA (US)

(73) Assignee: MKS Instruments, Inc., Andover, MA (US)

( * ) Notice: Subject to any disclaimer, the term of this patent is extended or adjusted under 35 U.S.C. 154(b) by 236 days.

(21) Appl. No.: 14/994,668

(22) Filed: Jan. 13, 2016

(65) Prior Publication Data
US 2017/0198396 A1 Jul. 13, 2017

(51) Int. Cl.
*F16K 1/22* (2006.01)
*F16K 3/06* (2006.01)
*F16K 15/02* (2006.01)
*F16K 51/02* (2006.01)
*H01J 37/32* (2006.01)
*C23C 16/513* (2006.01)

(52) U.S. Cl.
CPC .............. *C23C 16/513* (2013.01); *F16K 1/22* (2013.01); *F16K 3/06* (2013.01); *F16K 15/026* (2013.01); *F16K 51/02* (2013.01); *H01J 37/32348* (2013.01); *H01J 37/32844* (2013.01); *Y02C 20/30* (2013.01)

(58) Field of Classification Search
CPC ....... C23C 16/513; F16K 1/22; F16K 15/026; F16K 51/02; F16K 3/06; H01J 37/32844; H01J 37/32348; Y02C 20/30
See application file for complete search history.

(56) References Cited

U.S. PATENT DOCUMENTS 5,707,451 A 1/1998 Robles et al.
5,827,370 A 10/1998 Gu
(Continued)

FOREIGN PATENT DOCUMENTS

EP 2 312 612 A2 4/2011
JP 10-168574 6/1998

OTHER PUBLICATIONS

BOC Edwards, iH Dry Vacuum Pumping system,2003, BOC Edwards, tittle, 5 paragraphs discussing vacuum pump andelectrical ground.*

(Continued)

*Primary Examiner* — Gordon Baldwin
*Assistant Examiner* — Mirza Israr Javed
(74) *Attorney, Agent, or Firm* — Proskauer Rose LLP

(57) ABSTRACT

A valve assembly is provided that comprises a vacuum valve including a body and an electrically grounded surface on at least a surface of the body and an electrode extending substantially parallel to the electrically grounded surface and adjacent to the vacuum valve. The vacuum valve assembly also includes a barrier dielectric, a least a portion of which is located between the electrode and the electrically grounded surface. The vacuum valve assembly further includes a dielectric barrier discharge structure formed from the electrically grounded surface, the electrode, and the barrier dielectric. The dielectric barrier discharge structure is adapted to generate a plasma on the electrically grounded surface to clean at least a portion of the vacuum valve.

22 Claims, 10 Drawing Sheets

(56) References Cited

U.S. PATENT DOCUMENTS

| | | |
|---|---|---|
| 6,193,802 B1 | 2/2001 | Pang et al. |
| 6,255,222 B1 | 7/2001 | Xia et al. |
| 6,354,241 B1 | 3/2002 | Tanaka et al. |
| 9,314,824 B2 | 4/2016 | Gu et al. |
| 9,597,634 B2 | 3/2017 | Dickinson et al. |
| 2003/0007910 A1 | 1/2003 | Diamant Lazarovich et al. |
| 2005/0011445 A1* | 1/2005 | Upham ............... C23C 16/4405 118/715 |
| 2007/0286766 A1 | 12/2007 | Choi |
| 2013/0146225 A1 | 6/2013 | Chen et al. |
| 2015/0252472 A1 | 9/2015 | Ko et al. |
| 2015/0252473 A1 | 9/2015 | Dickinson |
| 2015/0314233 A1 | 11/2015 | Hur et al. |
| 2017/0173521 A1 | 6/2017 | Dickinson et al. |

OTHER PUBLICATIONS

EBARA Corporation, Instruction manual Multi-Stage Dry Vacuum Pump Model EV-A10, Oct. 15, 2012,EBARA Corporation, 3 paragraphs discusssing grounding.*

Pfeiffer vacuum, Pascal Series Rotary Vane Pumps 5 to 21 m3/h, operating instructions, Oct. 2013, Pfeiffer vacuum, paragraph discussing ground.*

Leybold Vacuum, DIVAC 0.6 L; 1.2L; 2.2 L Laboratory Pump with Modular Accessories, Jan. 1998, Leybold Vacuum, paragraph discussing ground.*

Hur Min et al., "AC Low-pressure Plasmas Generated by Using Annular-shaped Electrodes for Abatement of Pollutants Emitted during Semiconductor Manufacturing Processes", Journal of the Korean Physical Society, vol. 59, No. 4, Oct. 14, 2011, pp. 2742-2749.

\* cited by examiner

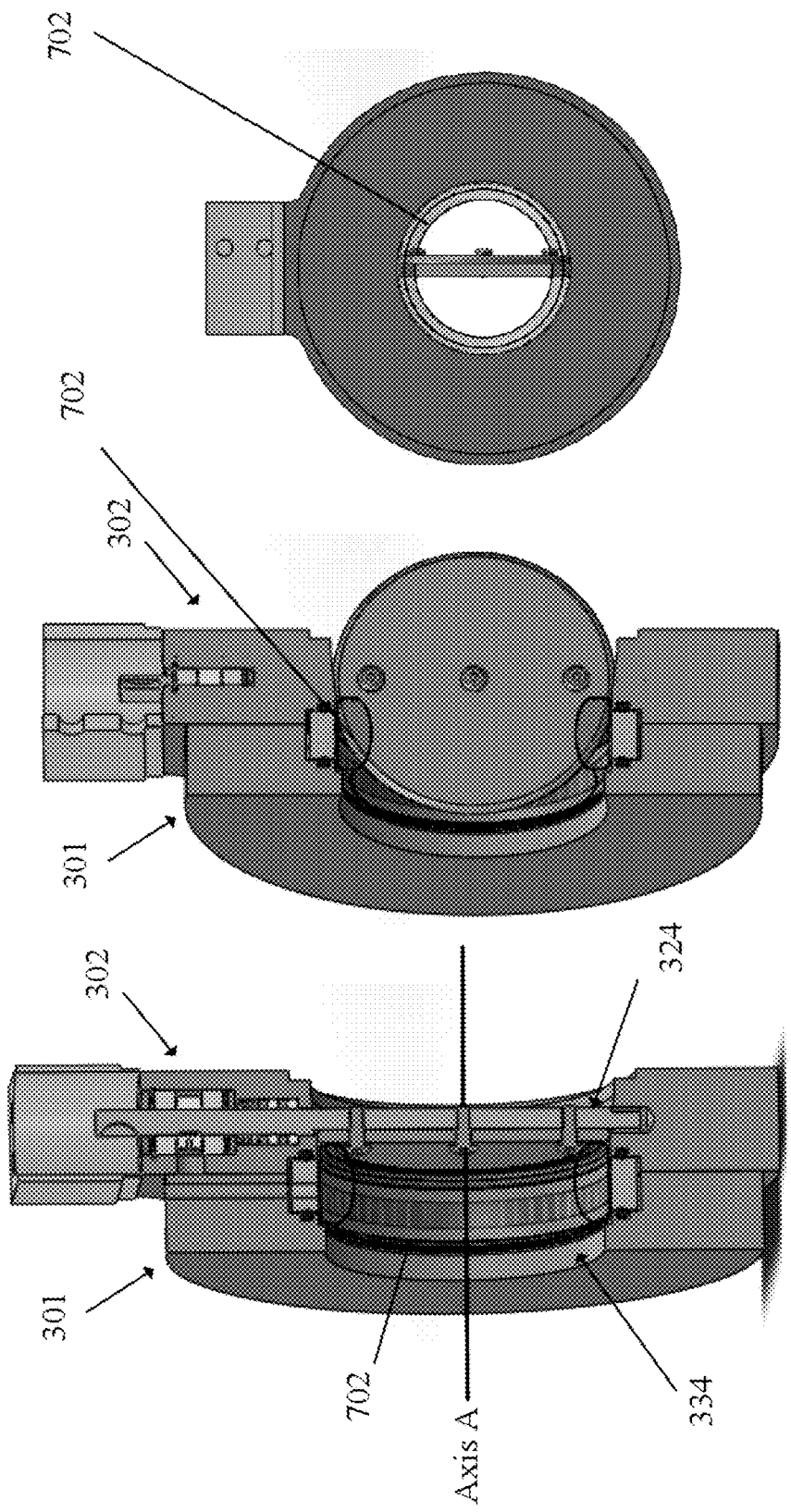

METHOD AND APPARATUS FOR VALVE DEPOSITION CLEANING AND PREVENTION BY PLASMA DISCHARGE

FIELD OF THE INVENTION

The invention generally relates to a valve assembly configured to generate localized plasma to process at least a portion of a valve.

BACKGROUND

Deposition processes, including chemical vapor deposition (CVD) processes, are commonly used in the manufacturing of semiconductor devices. For example, in a typical CVD process, reactant gases are introduces into a reaction chamber and directed to a heated substrate to induce controlled chemical reactions, which result in the deposition of a thin film on the surface of the substrate. During the deposition process, chamber pressure is precisely controlled by one or more mechanical devices, such as vacuum valves, connected downstream from the reaction chamber. For example, an isolation valve is typically connected directly to the exhaust gas port of the reaction chamber, a throttle valve is situated downstream from the isolation valve, and a vacuum pump is located further downstream from both of the isolation and throttle valves. The plumbing between the reaction chamber and the vacuum pump (e.g., the pipelines and valves) is generally referred to as a foreline or a roughing line.

During a deposition, process, the throttle valve can cycle between open and closed positions to regulate the gas pressure inside of the reaction chamber. Most of the material produced from the reactant gases is deposited on the substrate surface in the reaction chamber. However, some material is also deposited on surfaces outside of the reaction chamber, such as on the throttle valve. As unwanted material accumulates on the throttle valve, the throttle valve's useful life can be reduced by, for example, introduction of seal wear, load addition, requirement for high torque drive systems, and alteration of conductance characteristics. Ultimately, unwanted material deposits on a throttle valve diminish the precise operation of the valve, thereby reducing the valve's ability to control gas pressure inside of the reaction chamber. Other vacuum valves along the roughing line can be similarly affected by unwanted material deposition. In addition, the position of a throttle valve during closed loop pressure control can provide useful diagnostic information. However, because valve position varies with quantity of deposition, unwanted deposition on a valve can limit the usefulness of valve positioning as an indication of other changes in the system.

Typically, an operator needs to manually remove valves in a mechanical system for cleaning or replacement. This requires downtime of the tool and venting of the foreline plumbing. Alternatively, remote plasma sources have been used for pump and foreline cleaning, where the plasma output is directed at the foreline, but not so close to the valves as to provide optimized and targeted component cleaning.

SUMMARY

Therefore systems and methods are needed to provide automatic, targeted cleaning of a valve (e.g., a throttle valve) and prevent deposition on the valve in the first place. The present invention provides an assembly for generating localized plasma that can substantially eliminate accumulated deposition on a valve and prevent future deposition. For example, the present invention provides a plasma source integrated with a valve to create a localized plasma at one or more target locations where deposition is problematic for the valve.

In one aspect, a valve assembly is provided that comprises a vacuum valve including an electrically grounded surface and an electrode adjacent to the electrically grounded surface of the vacuum valve. The valve assembly also includes a barrier dielectric, a least a portion of which is located between the electrode and the electrically grounded surface. The valve assembly further includes a dielectric barrier discharge structure formed from the electrically grounded surface, the electrode, and the barrier dielectric. The dielectric barrier discharge structure is adapted to generate a plasma on the electrically grounded surface to process at least a portion of the vacuum valve.

In some embodiments, the valve assembly further comprises a buried electrode assembly including the electrode, the barrier dielectric and an isolator dielectric. A body of the vacuum valve and the buried electrode assembly can be substantially cylindrical, such that the body and the buried electrode assembly are concentrically aligned along a longitudinal axis. In some embodiments, the valve assembly further includes an extension portion coupled to the body of the vacuum valve for securing the buried electrode assembly against the vacuum valve.

In some embodiments, the electrode is formed on an interior surface of the barrier dielectric. In some embodiments, the electrically grounded surface forms a grounded electrode for generating the plasma. The electrode or the electrically grounded surface can include at least a portion of a control element of the vacuum valve. In some embodiments, the vacuum valve assembly further comprises a power supply connected between the electrode and the electrically grounded surface for generating the plasma.

In some embodiments, the vacuum valve comprises at least one of a throttle valve, isolation valve or pendulum valve. In some embodiments, the barrier dielectric comprises at least one of quartz, alumina, glass or polymide.

In some embodiments, the vacuum valve, the electrode and the barrier dielectric comprise a unitary structure. Alternatively, each of the vacuum valve or the electrode is a replaceable consumable.

In another aspect, a method is provided that includes providing a vacuum valve including a body and a control element, electrically grounding a surface of at least one of the body or the control element to form an electrically grounded surface, and locating an electrode adjacent to the electrically grounded surface of the vacuum valve. The method also includes inserting at least a portion of a barrier dielectric between the electrode and the electrically grounded surface of the vacuum valve, and creating a dielectric barrier discharge structure using the electrode, the barrier dielectric, and the electrically grounded surface. The dielectric barrier discharge structure is adapted to generate a localized plasma coupled to the vacuum valve for processing at least a portion of the vacuum valve.

In some embodiments, the method further includes locating the electrode on an interior surface of the barrier dielectric. In some embodiments, the method further includes securing the electrode and the barrier dielectric against the body of the vacuum valve.

In some embodiments, the method further includes providing a high voltage alternative current (AC) between the electrode and the electrically grounded surface to generate the localized plasma. In some embodiments, a power of the localized plasma is about 15 Watts at about 2 Torr.

In some embodiments, the method further includes locating the vacuum valve and the dielectric barrier discharge structure downstream from a wafer processing chamber. The method can further include using the localized plasma to clean the at least a portion of the vacuum valve in at least one of a prevention mode during an operation of the wafer processing chamber or an elimination mode after an operation of the wafer processing chamber. The localized plasma can also be used to clean at least a portion of a roughing line adjacent to the vacuum valve.

The prevent mode can comprise generating a primary plasma in the wafer processing chamber in connection with performance of a wafer deposition process within the wafer processing chamber, generating, in connection with the wafer deposition process within the wafer processing chamber, a gaseous byproduct that flows from the wafer processing chamber to the vacuum valve, and generating the localized plasma coupled to the vacuum valve, during the performance of the wafer deposition process within the wafer processing chamber, to prevent condensation of the gaseous byproduct to solid deposits on the vacuum valve.

The elimination mode can include generating a primary plasma in the wafer processing chamber in connection with execution of a wafer deposition process within the wafer processing chamber, generating, in connection with the wafer deposition process within the wafer processing chamber, solid deposits on the vacuum valve, and generating the localized plasma coupled to the vacuum valve, after the execution of the wafer deposition process, to substantially etch away the solid deposits on the vacuum valve. In some embodiments, the elimination mode further includes supplying a cleaning gas to the vacuum valve prior to generating the localized plasma.

BRIEF DESCRIPTION OF THE DRAWINGS

The advantages of the invention described above, together with further advantages, may be better understood by referring to the following description taken in conjunction with the accompanying drawings. The drawings are not necessarily to scale, emphasis instead generally being placed upon illustrating the principles of the technology.

FIGS. 7a and b show sectional views of the valve assembly of FIGS. 3a and b with a localized plasma generated to process the throttle valve that is illustrated in closed and open positions, respectively.

FIG. 8 shows a top view of the valve assembly of FIGS. 7a and b comprising the localized plasma.

DETAILED DESCRIPTION

In a deposition process, there are generally two types of chemical reactions that can create unwanted material deposition on components (e.g., a throttle valve) along a foreline. One type of chemical reactions is rate limited reactions, where not most or all reactants (e.g., input gases) in the reaction chamber are consumed at the wafer plane. Instead, the reactions that are intended to occur on the wafer can also occur further downstream and/or outside of the chamber. For example, gases supplied to the reaction chamber can continue to react when pumped out of the chamber. A wall interaction can increase the likelihood of such rate limited reactions, where two gas reactants are pumped out of the reaction chamber and adhere to the same surface, on which reaction subsequently occurs to generate byproducts. In some cases, a wall interaction is more likely to occur on the surface of a control element of a valve (e.g., on the backside of the flapper of a throttle valve) due to eddy current flow pattern of gases being pumped out of the reaction chamber. In some cases, high pressure (e.g., sub-atmospheric pressure) processes are more likely to experience rate limited reactions. The byproducts generated from rate limited reactions can be in the form of solids and/or vapor. Another type of chemical reaction is reactant limited, where gas reactants are consumed on the wafer in the reaction chamber and byproducts from the reactions, possibly in a solid form, are pumped from the reaction chamber and exit downstream through the foreline. In some cases, a reactant limited reaction can result in a more chemically stable byproduct in comparison to a byproduct from a rate limited reaction. Transitions between rate limited reactions and reactant limited reactions can be manipulated with process temperature and pressure. Generally, solid and/or vapor byproducts generated from both rate limited reactions and reactant limited reactions can become unwanted material deposition on one or more components of the foreline.

Figure 1:
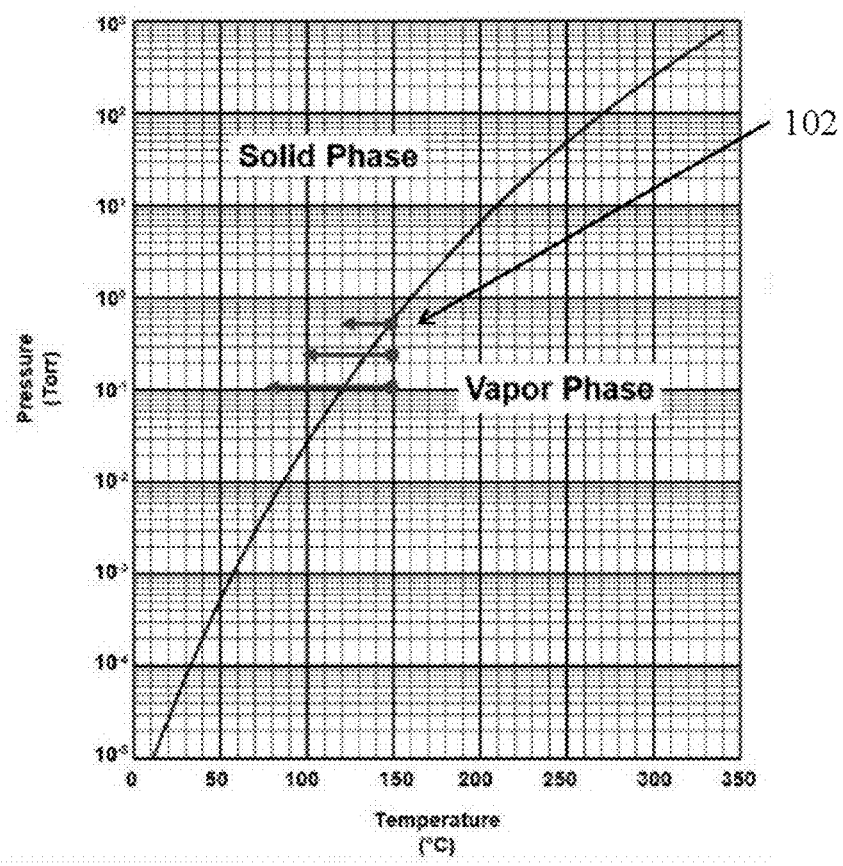
FIG. 1 shows an exemplary phase diagram of ammonium chloride, which is a common byproduct in a foreline.

FIG. 1 shows an exemplary phase diagram of ammonium chloride, which is a common, chemically-stable byproduct in a foreline that can be produced from a reactant limited reaction. As shown, a relatively small temperature drop in the foreline, such as in the range of about 10 C to 30 C, can lead to condensation 102 of ammonium chloride from vapor to solid, which is a form that allows the byproduct to easily accumulate on one or more surfaces in the foreline as unwanted deposits. In addition, a foreline pressure of greater than about 200 m Torr, when the foreline is heated to about 150 C, which is a common process condition, allows little margin for gas cooling before such undesirable condensation occurs. Therefore, cooling along the foreline can accelerate material deposition on the components in the foreline. For example, because velocity in a throttle valve can dramatically increase at throttle point, this may lead to a decrease in enthalpy, lower gas temperature, and cooling near the throttle valve due to conservation of energy. Moreover, according to the theory of Joule-Thomson cooling, even with constant enthalpy, non-ideal gas behavior can cause temperature to drop, where the amount of drop is highly dependent on gas, pressure and/or temperature conditions. As illustrated by the exemplary phase diagram of ammonium chloride in FIG. 1, a drop in temperature around the throttle valve can cause the byproduct to change from vapor to solid that is easily deposited on the throttle valve. Therefore, to prevent deposition on foreline components, systems and methods are needed to increase the environmental temperature so as to maintain gaseous byproducts in a vapor state. In addition, systems and methods are needed to reduce/eliminate solid byproducts already deposited on the components.

In one aspect, a valve assembly is provided that includes a dielectric barrier discharge structure integrated with a valve, where the valve assembly can generate a localized plasma to prevent deposition on the valve (e.g., by maintaining gaseous byproducts in its vapor form) and/or etch away existing deposits on the valve (e.g., by interacting with at least one cleaning gas). The valve suitable for use in the valve assembly can be any type of valve, such as a vacuum valve, which can be a throttle valve, isolation valve or pendulum valve.

Figure 2A:
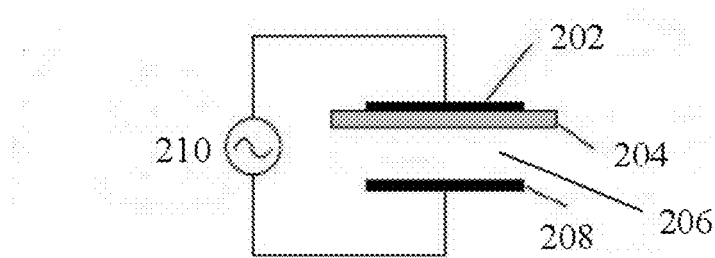
FIGS. 2a-c show several exemplary dielectric barrier discharge configurations based on which the valve assembly of the present invention can be constructed.
Figure 2B:
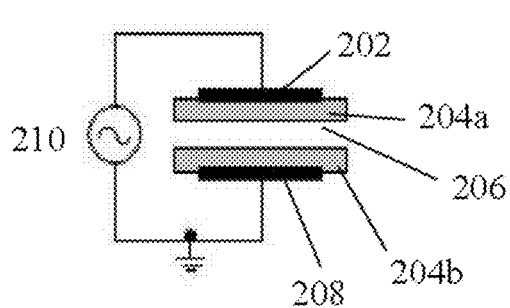
Figure 2C:
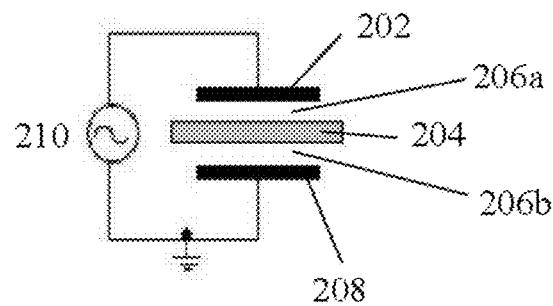

FIGS. 2a-c show several exemplary dielectric barrier discharge configurations based on which the valve assembly of the present invention can be constructed. As shown, a dielectric barrier discharge generally includes an electrode 202, at least one barrier dielectric layer 204, at least one discharge gap 206, and an electrically grounded electrode 208. A power supply 210 is connected between the electrode 202 and the ground electrode 208. There are several possible arrangements of the barrier dielectric layer(s) 204 and the discharge gap(s) 206 in a dielectric barrier discharge structure. For example, as shown in FIG. 2a, a barrier dielectric layer 204 can physically contact the electrode 202 with the discharge gap 206 situated between the barrier dielectric 204 and the ground electrode 208. In FIG. 2b, two barrier dielectric layers 204a, 204b can physically contact each of the electrodes 202, 208 with the barrier discharge gap 206 sandwiched between the two barrier dielectric layers. In FIG. 2c, the barrier dielectric layer 204 is physically isolated from both of the electrodes 202, 208 by discharge gaps 206a and 206b. Other dielectric barrier discharge structures are possible and are within the scope of the present invention. In operation, as the power supply 208 provides a high-voltage, alternative current (AC) between the electrode 202 and the ground electrode 208, charges migrate through the barrier dielectric layer(s) 204 and collect on the surface of these layer(s) 204. When surface potential reaches a breakdown threshold voltage, a large number of small discharges occur every half cycle of the AC waveform to generate a plasma. The plasma is sustained if the continuous energy source provides the required degree of ionization, overcoming the recombination process leading to the extinction of the discharge plasma.

Figures 3A, 3B:
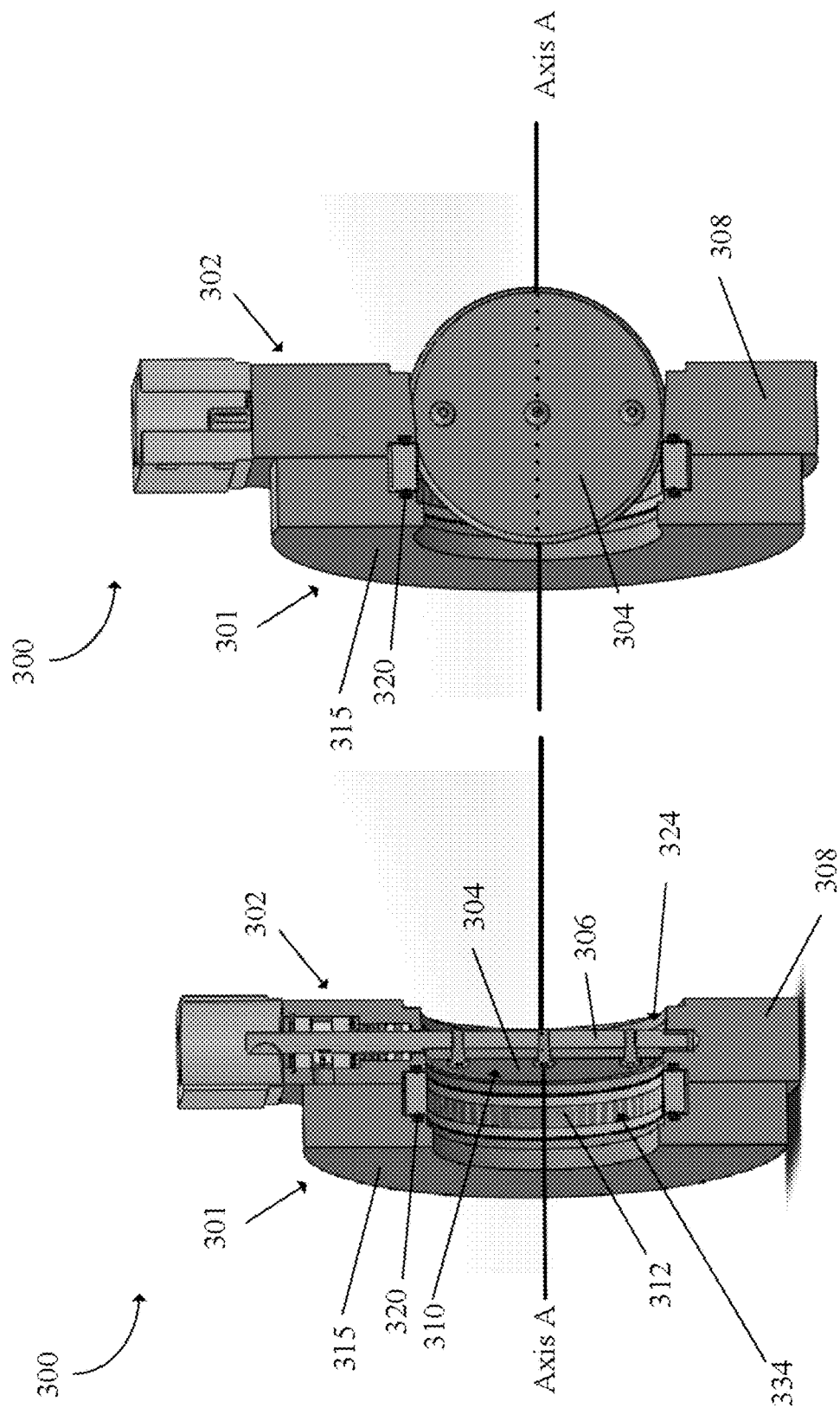
FIGS. 3a and b show sectional views of an exemplary valve assembly including a buried electrode assembly coupled to a throttle valve illustrated in closed and open positions, respectively.
Figure 4:
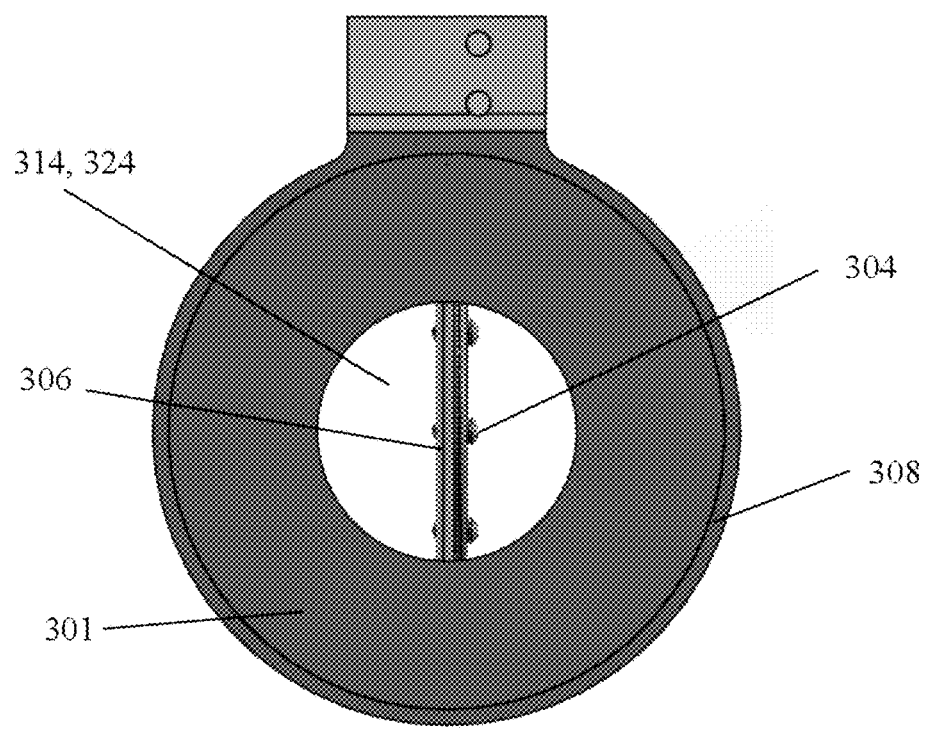
FIG. 4 shows a top view of the valve assembly of FIGS. 3a and b with the throttle valve in the open position.

FIGS. 3a and b show sectional views of an exemplary valve assembly 300 including a buried electrode assembly 301 coupled to a throttle valve 302 illustrated in closed and open positions, respectively. FIG. 4 shows a top view of the valve assembly 300 of FIGS. 3a and b with the throttle valve 302 in the open position. As shown, the throttle valve 302 of the valve assembly 300 includes a control element 304 (e.g., a circular flapper), a shaft 306 used to rotate the control element 304 between open and closed positions, and a body 308 through which gas flows when the control element 304 is in the open position. The body 308 of the throttle valve 302 can be cylindrical and disk-shaped with a central opening 324 to accommodate the movement of the control element 304. The valve body 308 can be made of stainless steel or anodized aluminum, for example. The valve body 308 defines a longitudinal axis A extending through the opening 324. Conductance of the throttle valve 302 is a function of the distance between the inside surface of the body 308 (i.e., the surface on the circumference of the opening 324) and the circumference of the control element 304.

At least one surface of the throttle valve body 308, the control element 304 or the shaft 306 can be electrically grounded. In some embodiments, once a surface of the valve body 308 is electrically grounded, the entire valve body 308 becomes electrically grounded. In general, an electrically grounded surface 310 refers to a grounded surface of the throttle valve 302 to which a localized plasma is directed due to the placement of the buried electrode assembly 301 in relation to the throttle valve 302. Because plasma tries to occupy the lowest energy state possible, it tends to discharge from the buried electrode assembly 301 to whatever grounded surface that is the closest to the buried electrode assembly 301. Therefore, by selectively positioning the buried electrode assembly 301 in relation to the throttle valve 302, an operator can perform targeted, in-situ cleaning of desired portions of the valve 302 with an integrated plasma source. In some cases, the electrically grounded surface 310 can be a "wetted" surface or "interior vacuum exposed" surface of the throttle valve 302. The electrically grounded surface 310 can be located on the control element 304, the throttle valve body 308, the shaft 306, or another surface on or close to the throttle valve 302 that supports an electrical discharge.

Figure 5:
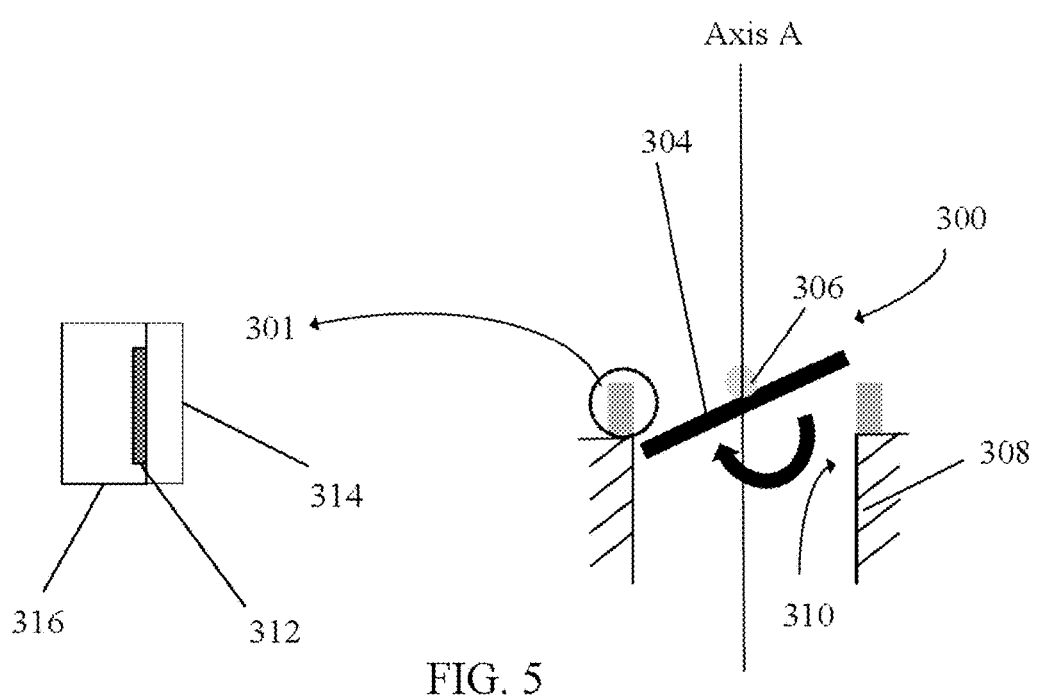
FIG. 5 shows a detailed view of at least a portion of the buried electrode assembly within the valve assembly of FIGS. 3a and b.

FIG. 5 shows a detailed view of at least a portion of the buried electrode assembly 301 of FIGS. 3a and b within the valve assembly 300. As shown, the buried electrode assembly 301 includes an electrode 312, a barrier dielectric 314, and an isolator dielectric 316. The electrode 312 is sandwiched between the isolator dielectric 316 and the barrier dielectric 314 such that the electrode 312 is formed on the interior surfaces of the two components. In some embodiments, the buried electrode assembly 301 radially surrounds the control element 304 of the throttle valve 302, where the barrier dielectric 314 is closest to the control element 304 in the radial direction (i.e., a direction that is perpendicular to the longitudinal Axis A) and the isolator dielectric 316 is furthest away from the control element 304 in the radial direction. The electrode 312 is also adjacent to the electrically grounded surface 310 on or close to the throttle valve 302 with at least a portion of the barrier dielectric 314 located between the electrode 312 and the electrically grounded surface 310. In some embodiments, at least one of the isolator dielectric 316 or the barrier dielectric 314 is made of quartz, alumina, glass or a stable polymer such as polymide (e.g., Klypton). In some embodiments, the electrode 312 is made of tungsten.

With reference to FIGS. 3a and b, the buried electrode assembly 301 can be similarly shaped as the body 308 of the throttle valve 302 (e.g., cylindrical and disk-shaped) such that the two components 301, 308 can concentrically align and stack together along the longitudinal axis A. Specifically, the disk-shaped buried electrode assembly 301 can have a circular, central opening 334 that substantially aligns with the central opening 324 of the valve body 308 along the longitudinal axis A when the buried electrode assembly 301 is attached to the valve 302. In some embodiments, the electrode 312, barrier dielectric 314, and isolator dielectric 316 are cylindrical and can be concentrically arranged about the longitudinal Axis A to form the buried electrode assembly 301, where the electrode 312 substantially surrounds the barrier dielectric 314 and the isolator dielectric 316 substantially surrounds the electrode 312. In some embodiments, the buried electrode assembly 301 includes an extension portion 315, made of stainless steel, for example, configured to secure the buried electrode assembly 301 against the throttle valve 302. In some embodiments, one or more vacuum seals 320 can be used to attach a substrate of the electrode 312 to the valve body 308.

Generally, the valve assembly 300 includes a dielectric barrier discharge structure that is created based on the electrically grounded surface 310 and the buried electrode assembly 301. A power supply (not shown) can be connected between the electrode 312 of the buried electrode assembly 301 and the electrically grounded surface 310 to generate a localized plasma that is directed toward the electrically grounded surface 310 to clean the surface and its vicinity. In some embodiments, the dielectric barrier discharge structure of the valve assembly 300 can be configured to have similar geometry and construction as one of the dielectric barrier discharge configurations of FIGS. 2a-c by suitable arranging the electrode 312, the isolator dielectric 316, and/or the barrier dielectric 314 in relation to the electrically grounded surface 310. For example, the electrically grounded surface 310 can serve substantially the same function as the electrically grounded electrode 208, the electrode 312 can be constructed to be substantially the same as the electrode 202, and the barrier dielectric 314 can be constructed to be substantially the same as the barrier dielectric layer(s) 204. In addition, a gap between the buried electrode assembly 301 and the grounded surface 310 of the throttle valve 302 can serve as a discharge gap, similar to the discharge gap 206 of FIGS. 2a-c.

Figure 6A:
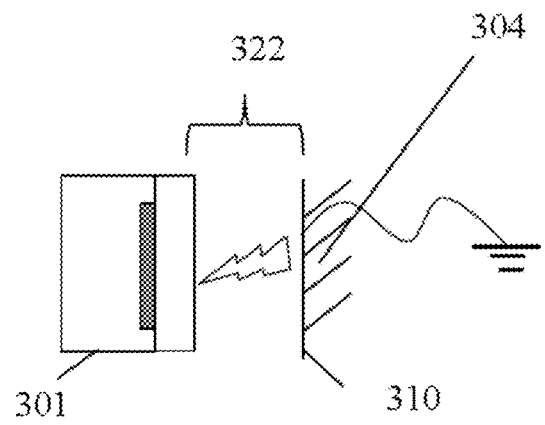
FIGS. 6a-c show various exemplary electrically grounded surfaces that support electrical discharge and plasma formation in relation to the buried electrode assembly of FIGS. 3a and b.
Figure 6B:
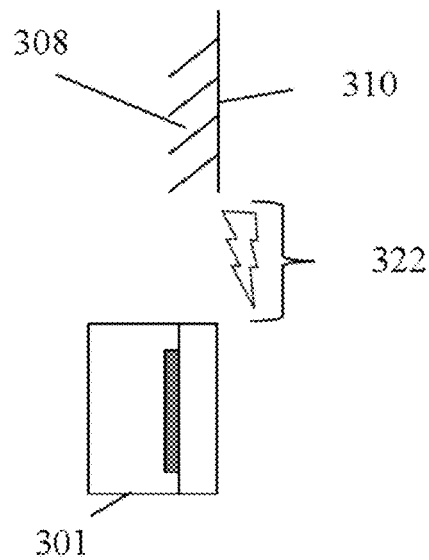
Figure 6C:
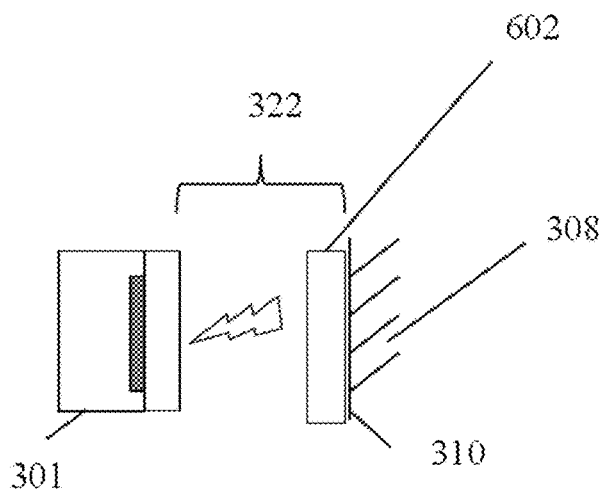

As described above, the electrically grounded surface 310 can be any surface on or close to the throttle valve 302 that supports an electrical discharge, so long as the buried electrode assembly 301 is located sufficiently close to the electrically grounded surface 310 to form a plasma through dielectric barrier discharge. FIGS. 6a-c show various exemplary electrically grounded surfaces 310 that support electrical discharge and plasma formation in relation to the buried electrode assembly 301. As described above, by selectively positioning the buried electrode assembly 301 in relation to the throttle valve 302, an operator can choose the electrically grounded surface 310 to which the resulting plasma discharge is targeted. In FIG. 6a, the electrically grounded surface 310 is located on the control element 304 of the throttle valve 302, and a plasma can be formed in the discharge gap 322 between the buried electrode assembly 301 and the grounded surface of the control element 304. In FIG. 6b, the electrically grounded surface 310 is located on an inner surface of the valve body 308 (e.g., the inner cylindrical surface of the central opening 324 of the valve body 308), and a plasma can be formed in the discharge gap 322 between the buried electrode assembly 301 and the grounded inner surface of the valve body 308. In FIG. 6c, a second, optional barrier dielectric 602 is inserted between the buried electrode assembly 301 and the electrically grounded surface 310 located on the valve body 308. This second barrier dielectric 602 can be used to reduce metallic sputtering in a barrier discharge, which can be a problem if the valve body 308 is made of anodized aluminum. In some embodiments, the anodized layer of the anodized aluminum body can serve as the second barrier dielectric 602. The electrically grounded surface 310 can be located on the aluminum layer underlying the anodized layer.

FIGS. 7a and b show sectional views of the valve assembly 300 with a localized plasma 702 generated to process the throttle valve 303 that is illustrated in closed and open positions, respectively. FIG. 8 shows a top view of the valve assembly 300 comprising the localized plasma 702. As shown, the plasma discharge 702 is created between the electrode 312 (located along the inner cylindrical surface of the central opening 334 of the buried electrode assembly 301) and the adjacent grounded surface 310 (located on the inner cylindrical surface of the central opening 324 of the throttle valve body 308). The plasma 702 can be a thin circular layer created along the inner cylindrical surfaces of the central openings 324 and 334. The plasma 702 can be concentric with and/or parallel to at least one of the isolator dielectric 316, the electrode 312 or the barrier dielectric 314 of the buried electrode assembly 301 along the longitudinal axis A. In operation, the plasma discharge 702 heats the nearby valve 302, with the electrically grounded surface 310 exposed to the most amount of heat. In some embodiments, a plasma discharge generated by the valve assembly 300 can have a power of about 15 Watts at about 2 Torr.

In some embodiments, the buried electrode assembly 301 is formed on one component of the throttle valve 302, while the electrically grounded surface 310 is on another component of the throttle valve 302. For example, the buried electrode assembly 301 can be formed on the control element 304 (e.g., with the control element 304 being the electrode 312), in which case the grounded electrical surface 310 becomes at least a portion of the inner cylindrical surface of the central opening 324 of the throttle valve body 308. The reverse can also be constructed. Specifically, the buried electrode assembly 301 can be formed on the valve body 308 (e.g., with the valve body 308 being the electrode 312), while the grounded electrical surface 310 is located on the control element 304. In these cases, the electrode 312 or the electrically grounded surface 310 comprises at least a portion of the control element 304.

In some embodiments, the valve assembly 300 is a unitary structure having the valve 302 and the buried electrode assembly 301 integrated as a single component. In some embodiments, each component of the valve assembly 300 (e.g., the valve 302 or the buried electrode assembly 301) is a consumable and can be separately replaceable. Further, components of the buried electrode assembly 301 (e.g., the isolator dielectric 316, electrode 312 or barrier dielectric 314) can be consumables and separately replaceable.

Even though the valve assembly 300 is described above with respect to a throttle valve, the valve assembly can be easily adapted to clean other types of vacuum valves, including an isolation valve or a pendulum valve. In general, a valve assembly of the present invention can include a buried electrode assembly and a valve. The buried electrode assembly can be constructed from an electrode and at least one barrier dielectric. A surface of the valve (or a surface close to the valve) can be electrically grounded. Thus, the valve assembly is able to create a dielectric barrier discharge from the electrically grounded surface and the buried electrode assembly. In operation, the dielectric barrier discharge produces a plasma charge to process the valve and its vicinity (e.g., at least a portion of the foreline on which the valve is located).

Figure 9A:
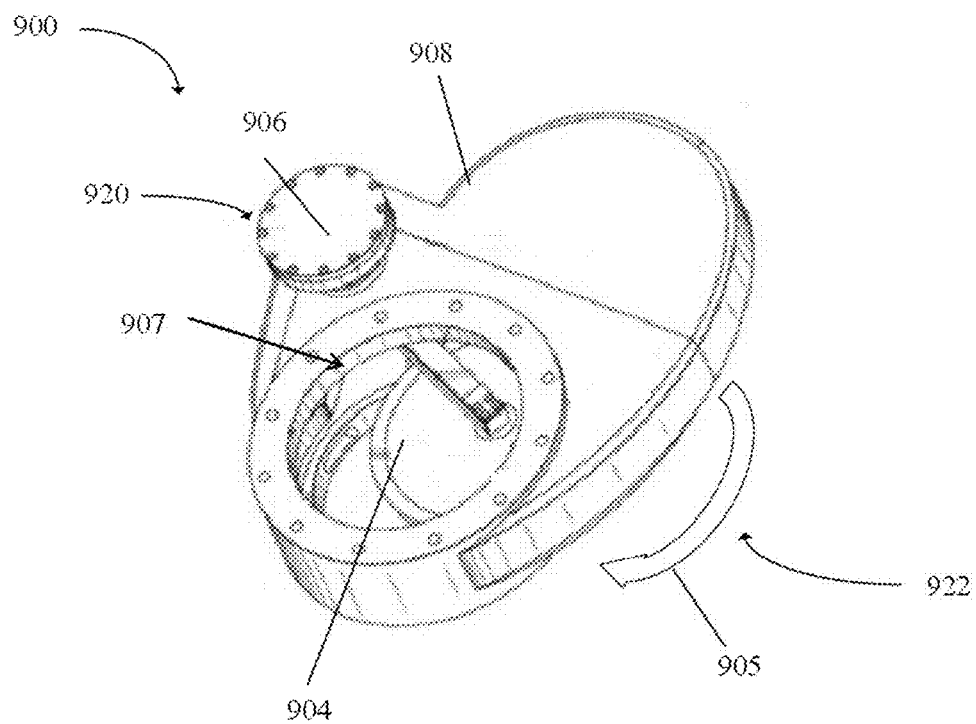
FIGS. 9a and b show side and cross-sectional views of an exemplary pendulum valve, respectively, based on which a valve assembly can be created to provide in-situ, localized processing of the valve.
Figure 9B:
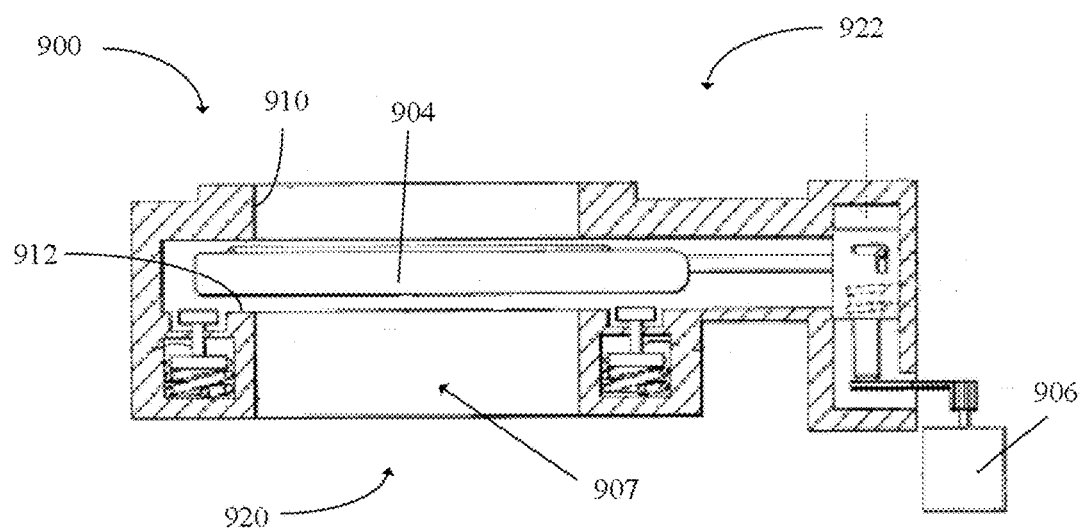

FIGS. 9a and b show side and cross-sectional views of an exemplary pendulum valve 900, respectively, based on which a valve assembly can be created to provide in-situ, localized processing of the valve 900. As shown, the pendulum valve 900 includes a control element 904 (e.g., a gate) and a shaft 906 used to rotate the control element 904 in a direction 905 between an open position to expose the opening 907 and a closed position to cover the opening 907. In addition, the pendulum valve 900 includes a body 908 through which gas flows when the control element 904 is in the open position. The valve body 908 generally defines a distal end 920 and a proximal end 922. The conductance of the pendulum valve 900 is a function of the amount of opening defined by the position of the control element 904 relative to the opening 907 disposed in the body 908.

At least one surface of the pendulum valve 900, including a surface of the valve body 908, the control element 904 or the shaft 906, can be electrically grounded to form an electrically grounded surface. For example, the electrically grounded surface can be located on a surface 910 along the circumference of the opening 907 that is proximal to the control element 904 (i.e., can be covered or uncovered by control element 904). As another example, the electrically grounded surface can be located on a surface 912 close to the opening 907 that is distal to the control element 904. Alternatively, the electrically grounded surface can be located on a surface (not shown) adjacent to the pendulum valve 900. In some embodiments, a buried electrode assembly (not shown), similar to the buried electrode assembly 301 described above with respect to the throttle valve 302, can be positioned adjacent to the pendulum valve 900 and the electrically grounded surface to generate a plasma discharge between the buried electrode assembly and the electrically grounded surface.

Figure 10:
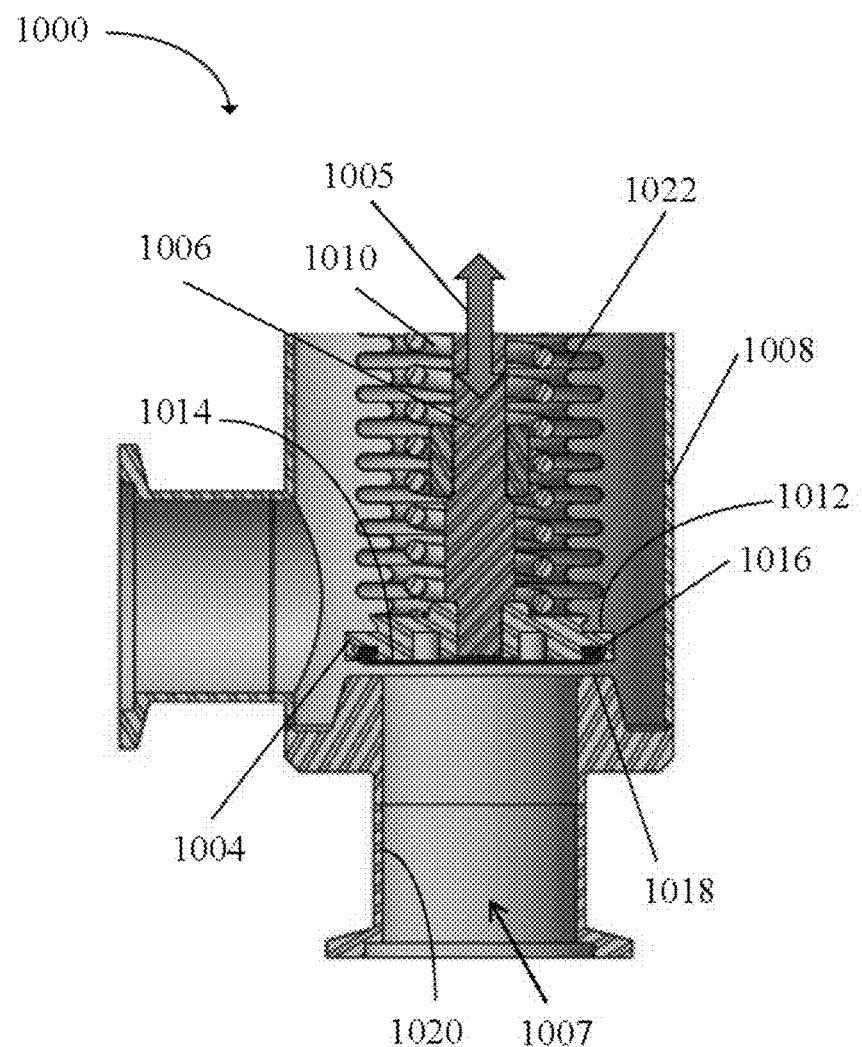
FIG. 10 shows a cross-sectional view of an exemplary isolation valve based on which a valve assembly can be created to provide in-situ, localized processing of the valve.

FIG. 10 shows a cross-sectional view of an exemplary isolation valve 1000 based on which a valve assembly can be created to provide in-situ, localized processing of the valve 1000. The isolation valve 1000 includes a control element 1004 (e.g., a nosepiece) and a shaft 1006 used to move the control element 1004 in a vertical direction 1005 between an open position to expose the opening 1007 and a closed position to block the opening 1007. In addition, the isolation valve 1000 includes a body 1008 through which gas flows when the control element 1004 is in the open position. As shown, the control element 1004 has a proximal surface 1012 and a distal surface 1014, where the proximal surface 1012 has a spring 1010 connected thereto and the distal surface 1014 has one or more o-rings 1016 attached thereto. Extension of the spring 1010 urges the control element 1004 to abut against a seat 1018 of the body 1008 of the valve 1000 such that the o-rings 1016 physically contact the seat 1018 to close the opening 1007. Retraction of the spring 1010 moves the control element 1004 away from the seat 1018 to uncover the opening 1007. The isolation valve 1000 can also include one or more bellows 1022 to isolate vacuum from atmosphere while permitting motion of the control element 1004 in the vertical direction 1005. The conductance of the isolation valve 1000 is a function of the amount of opening defined by the position of the control element 1004 relative to the seat 1018.

At least one surface of the isolation valve 1000, including a surface of the valve body 1008, the control element 1004 or the shaft 1006 can be electrically grounded to form an electrically grounded surface. For example, the electrically grounded surface can be located on the distal surface 1014 of the control element. As another example, the electrically grounded surface can be located on a surface 1020 of the valve body 1008 defining the opening 1007. In some embodiments, a buried electrode assembly (not shown), similar to the buried electrode assembly 301 described above with respect to the throttle valve 302, can be positioned adjacent to the isolation valve 1000 and the electrically grounded surface to generate a plasma discharge between the buried electrode assembly and the electrically grounded surface (e.g., in the opening 1007).

Figure 11:
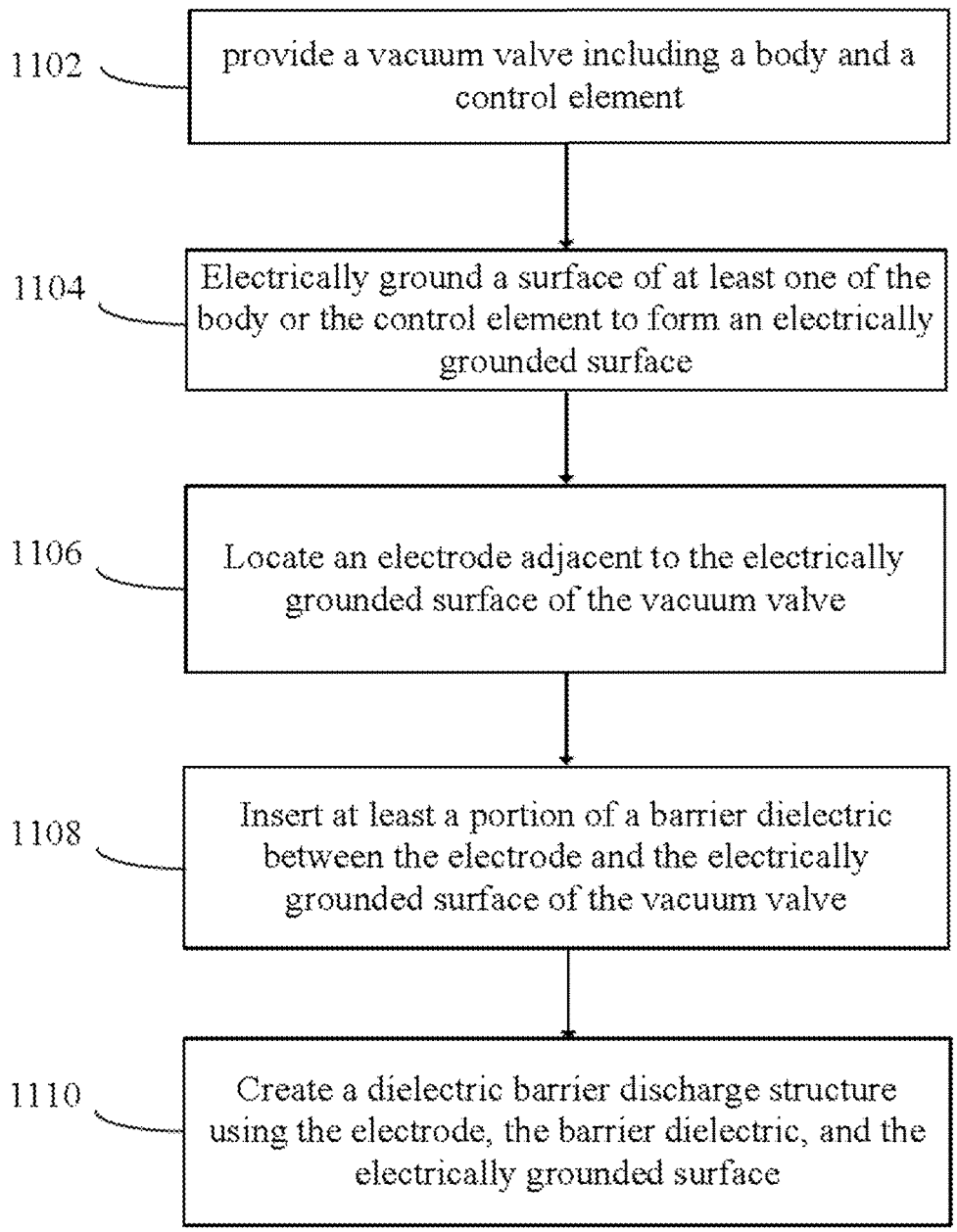
FIG. 11 shows an exemplary process for creating a valve assembly, such as the valve assembly of FIGS. 3-10.

FIG. 11 shows an exemplary process for creating a valve assembly, such as the valve assembly described above with reference to FIGS. 3-10. The process starts when a vacuum valve is provided (step 1102), such as the throttle valve 302, the pendulum valve 900 or the isolation valve 1000. The valve generally includes a body and a control element (e.g., the flapper 304 of the throttle valve 302, the gate 904 of the pendulum valve 900, or the nosepiece 1004 of the isolation valve 1000). A surface of the body or the control element of the valve can be electrically grounded to form an electrically grounded surface (step 1104). To form a buried electrode assembly, an electrode can be located adjacent to the electrically grounded surface of the vacuum valve (step 1106) and at least a portion of a barrier dielectric can be inserted between the electrode and the electrically grounded surface (step 1108). The buried electrode assembly can be arranged such that the electrode is on an interior surface of the barrier dielectric. In some embodiments, an isolator dielectric is also included in the buried electrode assembly, with the electrode placed on an interior surface of the isolator dielectric. That is, the electrode can be sandwiched between the isolator dielectric and the barrier dielectric. A dielectric barrier discharge structure is thereby created based on the buried electrode assembly (including the electrode and the barrier dielectric) and the electrically grounded surface (step 1110). The dielectric barrier discharge structure is adapted to generate a localized plasma coupled to the vacuum valve, such as between the buried electrode assembly and the electrically grounded surface, to process at least a portion of the vacuum valve. A high voltage alternative current can be supplied between the electrode and the electrically grounded surface to activate the dielectric barrier discharge structure to generate the localized plasma. In some embodiments, the power of the resulting plasma is about 15 Watts at about 2 Torr.

Figure 12:
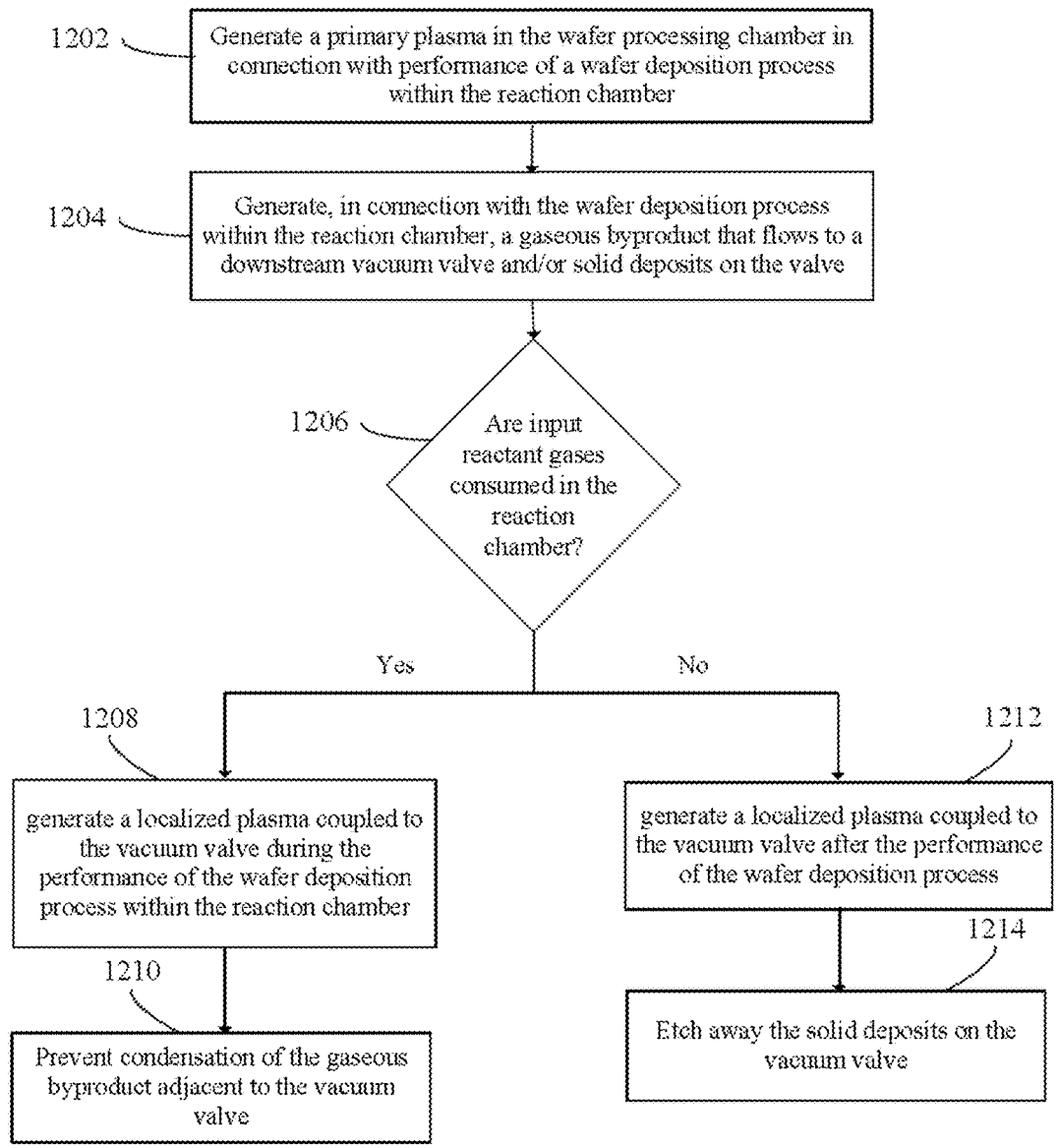
FIG. 12 shows an exemplary process for using a valve assembly of the present invention, which includes a buried electrode assembly and a valve, to clean at least a portion of the valve in one of two modes of operation.

In some embodiments, a valve assembly of the present invention is located downstream from a reaction chamber used to process wafers in a deposition process. As described above, solid and/or vapor byproducts from a deposition process can become unwanted material deposition on a valve that is downstream from the reaction chamber. Therefore, forming a valve assembly about a valve in the foreline enables targeted, in-situ cleaning of the valve. FIG. 12 shows an exemplary process for using a valve assembly of the present invention, which includes at least a buried electrode assembly and a valve, to clean at least a portion of the valve in one of two modes of operation. The process starts with the generation of a primary plasma in the reaction chamber in connection with a wafer deposition process within the chamber (step 1202). As described above, the wafer deposition process can potentially cause unwanted material deposition on the downstream vacuum valve due to the production of gaseous byproducts that can flow downstream to the valve and/or solid materials that can deposit on the valve (step 1204). A determination is made of whether the wafer deposition process in the reaction chamber is a rate limited process (i.e., if some of the input reactant gases are not consumed at the wafer plane) or a reactant limited process (i.e., if most or all of the input reactant gases are consumed at the wafer plane) (step 1206). If a reactant limited process is determined, a prevention mode of operation is executed that takes place substantially during the deposition process in the reaction chamber. Otherwise, the wafer deposition process is a rate limited process and an elimination mode of operation is executed after wafers are removed from the reaction chamber and the chamber is relatively inactive. As described above, a reactant limited reaction tends to produce more chemically stable byproducts than a rate limited reaction. When a plasma is applied to a gaseous byproduct, the resulting heat can also dissociate many of the molecules in the byproduct into their constituent elements. If the original molecules are chemically stable (e.g., from a reactant limited reaction), they are adapted to reform into the same stable modules after plasma heating. However, if the original molecules in a byproduct are not stable (e.g., from a rate limited reaction), the dissociated elements are likely to form into other molecules that can become unwanted deposits on the foreline components. Therefore, for a rate limited reaction, localized plasma is not activated during wafer deposition since localized plasma heating during deposition can produce additional solid deposits. However, for a rate limited reaction, localized plasma can be activated after wafer deposition to clean away the solid deposits with the aid of certain cleaning chemistry.

In the prevention mode of operation, the valve assembly that incorporates the valve to be cleaned can be activated (e.g., by applying a high voltage alternative current) to generate a localized plasma between the electrically grounded surface on the valve and the adjacent buried electrode assembly (step 1208). The localized plasma can be sustained during at least a portion of the wafer deposition process to prevent condensation of gaseous byproducts to solid deposits on the valve (step 1210), where the gaseous byproducts tend to be chemically stable. In some embodiments, the localized plasma is sustained slightly after the completion of the wafer deposition process in the reaction chamber. Hence, the primary plasma in the reaction chamber and the localized plasma in the valve assembly downstream from the reaction chamber can occur about the same time or at least overlap at least a portion of the time in the prevention mode of operation. In the prevention mode, the localized plasma of the valve assembly is used to heat the gaseous byproduct so that it remains in the vapor form even when the temperature in the valve cools due to, for example, the throttling processing if the valve is a throttle valve. Therefore, the prevention mode is adapted to prevent deposition from occurring in the first place due to condensation of gasses caused by their rapid cooling during pressure reduction function inherent in a valve.

Alternatively, in the elimination mode of operation, the valve assembly can be activated to generate a localized plasma after the performance of wafer deposition in the reaction chamber (step 1212). The localized plasma can etch away the solid deposits that have already formed on the valve. Hence, there can be substantially little or no overlap between the generation of the primary plasma in the reaction chamber and the generation of the localized plasma in the valve assembly. In some embodiments of the elimination mode of operation, a cleaning gas, such as a fluorinated or chlorinated gas (i.e. NF3), is supplied to the vacuum valve prior to activation of the localized plasma in the valve assembly. The cleaning gas interacts with the localized plasma to create radicals to etch away the solid deposits on the valve. In some embodiments of both modes of operation, the localized plasma can process not only the valve integrated with the valve assembly, but also adjacent portions of the foreline on which the valve is located.

In some embodiments, a control circuit (not shown) is provided to automate the process of FIG. 12. For example, the control circuit can automatically operate the valve assembly in the prevention mode during every wafer deposition process or during a deposition process after a certain number has already taken place. Similarly, the control circuit can automatically operate the valve assembly in the elimination mode after every wafer deposition or after a certain number of deposition processes. In some embodiments, the control circuit includes a power supply configured to generate a high-voltage AC to activate the localized plasma in a valve assembly. For example, the power supply can be a current-regulated power supply that can provide about 600 V to 1000 V at about 50 kHz. Plasma discharge by the valve assembly is adapted to clamp the voltage and current regulation controls power of the plasma. In some embodiments, multiple valve assemblies can be constructed around multiple valves along a foreline. The control circuit can independently control each valve assembly to clean the respective valve as needed. In some embodiments, the barrier discharge structure of a valve assembly can be similarly used to clean foreline plumbing other than a valve. For example a foreline that normally requires regular maintenance for removal of process deposits can include a surface barrier discharge source for in situ cleaning.

While the invention has been particularly shown and described with reference to specific embodiments, it should be understood by those skilled in the art that various changes in form and detail may be made therein without departing from the spirit and scope of the invention as defined by the appended claims.

What is claimed is:

1. A valve assembly comprising:
a vacuum valve including an electrically grounded surface;
an electrode adjacent to the electrically grounded surface of the vacuum valve;
a barrier dielectric, at least a portion of which is located between the electrode and the electrically grounded surface; and
a dielectric barrier discharge structure formed from the electrically grounded surface, the electrode, and the barrier dielectric, wherein the dielectric barrier discharge structure is adapted to generate a plasma in a gap between the barrier dielectric and the electrically grounded surface to process at least a portion of the vacuum valve, and wherein the electrically grounded surface of the vacuum valve forms a grounded electrode for generating the plasma.

2. The valve assembly of claim 1, further comprising a buried electrode assembly including the electrode, the barrier dielectric and an isolator dielectric.

3. The valve assembly of claim 2, wherein a body of the vacuum valve is cylindrical and the buried electrode assembly is cylindrical, wherein a circular opening in the body and a circular opening in the buried electrode assembly are concentrically aligned along a longitudinal axis.

4. The valve assembly of claim 1, wherein the electrode is formed on an interior surface of the barrier dielectric.

5. The valve assembly of claim 2, further comprising an extension portion coupled to a body of the vacuum valve for securing the buried electrode assembly against the vacuum valve.

6. The valve assembly of claim 1, wherein the vacuum valve comprises at least one of a throttle valve, isolation valve or pendulum valve.

7. The valve assembly of claim 1, wherein the electrode or the electrically grounded surface includes at least a portion of a control element of the vacuum valve.

8. The valve assembly of claim 1, wherein the vacuum valve, the electrode and the barrier dielectric comprise a unitary structure.

9. The valve assembly of claim 1, wherein each of the vacuum valve or the electrode is a replaceable consumable.

10. The valve assembly of claim 1, wherein the barrier dielectric comprises at least one of quartz, alumina, glass or polymide.

11. The valve assembly of claim 1, further comprising a power supply connected between the electrode and the electrically grounded surface for generating the plasma.

12. A method comprising:
providing a vacuum valve including a body and a control element;
electrically grounding a surface of at least one of the body or the control element to form an electrically grounded surface;
locating an electrode adjacent to the electrically grounded surface of the vacuum valve;
inserting at least a portion of a barrier dielectric between the electrode and the electrically grounded surface of the vacuum valve; and
creating a dielectric barrier discharge structure using the electrode, the barrier dielectric, and the electrically grounded surface, wherein the dielectric barrier discharge structure is adapted to generate a localized plasma coupled to the vacuum valve for processing at least a portion of the vacuum valve, and wherein the electrically grounded surface of the vacuum valve forms a grounded electrode for generating the plasma in a gap between the barrier dielectric and the electrically grounded surface.

13. The method of claim 12, further comprising locating the electrode on an interior surface of the barrier dielectric.

14. The method of claim 12, further comprising securing the electrode and the barrier dielectric against the body of the vacuum valve.

15. The method of claim 12, further comprising providing a high voltage alternative current (AC) between the electrode and the electrically grounded surface to generate the localized plasma.

16. The method of claim 12, wherein a power of the localized plasma is about 15 Watts at about 2 Torr.

17. The method of claim 12, further comprising locating the vacuum valve and the dielectric barrier discharge structure downstream from a wafer processing chamber.

18. The method of claim 17, further comprising using the localized plasma to clean the at least a portion of the vacuum valve in at least one of a prevention mode during an operation of the wafer processing chamber or an elimination mode after an operation of the wafer processing chamber.

19. The method of claim 18, wherein the prevention mode comprises:
generating a primary plasma in the wafer processing chamber in connection with performance of a wafer deposition process within the wafer processing chamber;
generating, in connection with the wafer deposition process within the wafer processing chamber, a gaseous byproduct that flows from the wafer processing chamber to the vacuum valve; and
generating the localized plasma coupled to the vacuum valve, during the performance of the wafer deposition process within the wafer processing chamber, to prevent condensation of the gaseous byproduct to solid deposits on the vacuum valve.

20. The method of claim 18, wherein the elimination mode comprises:
generating a primary plasma in the wafer processing chamber in connection with execution of a wafer deposition process within the wafer processing chamber;
generating, in connection with the wafer deposition process within the wafer processing chamber, solid deposits on the vacuum valve; and
generating the localized plasma coupled to the vacuum valve, after the execution of the wafer deposition process, to substantially etch away the solid deposits on the vacuum valve.

21. The method of claim 20, further comprising supplying a cleaning gas to the vacuum valve prior to generating the localized plasma.

22. The method of claim 18, further comprising using the localized plasma to clean at least a portion of a roughing line adjacent to the vacuum valve.

* * * * *